United States Patent
Petersen et al.

(10) Patent No.: US 6,804,810 B1
(45) Date of Patent: Oct. 12, 2004

(54) RESISTANCE AND CAPACITANCE ESTIMATION

(75) Inventors: Rex Mark Petersen, Fort Collins, CO (US); John D Wanek, Denver, CO (US); Jeremy Glen Slade, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 09/510,974

(22) Filed: Feb. 21, 2000

(51) Int. Cl.[7] .................................................. G06F 17/50
(52) U.S. Cl. ............................... 716/12; 716/1; 716/13
(58) Field of Search ............................... 716/1, 12, 13, 716/10

(56) References Cited

U.S. PATENT DOCUMENTS

| | | | | |
|---|---|---|---|---|
| 5,269,860 A | * | 12/1993 | Rice ........................... | 156/73.1 |
| 5,475,607 A | * | 12/1995 | Apte et al. ..................... | 716/10 |
| 5,629,860 A | * | 5/1997 | Jones et al. .................... | 716/6 |
| 5,764,532 A | | 6/1998 | Patel | |
| 5,896,300 A | * | 4/1999 | Raghavan et al. ............. | 703/15 |
| 5,901,063 A | * | 5/1999 | Chang et al. .................. | 703/5 |
| 5,974,247 A | * | 10/1999 | Yonezawa .................... | 703/19 |
| 6,016,000 A | * | 1/2000 | Moslehi ....................... | 257/522 |
| 6,026,228 A | * | 2/2000 | Imai et al. ..................... | 716/18 |
| 6,099,578 A | * | 8/2000 | Itoh ............................. | 716/12 |
| 6,117,182 A | * | 9/2000 | Alpert et al. .................. | 703/13 |
| 6,128,768 A | * | 10/2000 | Ho ............................... | 716/11 |
| 6,170,080 B1 | * | 1/2001 | Ginetti et al. ................. | 716/18 |
| 6,182,269 B1 | * | 1/2001 | Laubhan ....................... | 716/12 |
| 6,189,131 B1 | * | 2/2001 | Graef et al. ................... | 716/18 |
| 6,286,126 B1 | * | 9/2001 | Raghavan et al. ............. | 716/6 |
| 6,297,554 B1 | * | 10/2001 | Lin .............................. | 257/752 |
| 6,327,696 B1 | * | 12/2001 | Mahajan ....................... | 716/12 |
| 6,502,227 B1 | * | 12/2002 | Kato ............................ | 716/10 |

* cited by examiner

*Primary Examiner*—Stacy A. Whitmore

(57) ABSTRACT

A method of designing a VLSI chip and a chip designed according to the method are described. The method includes the steps of early consideration of resistive and capacitive values during a VLSI chip design process. The method provides for estimation of signal routes between nodes of functional blocks to be incorporated in the chips. The estimation may be based on a floor plan describing the positioning of the functional blocks, a connectivity description identifying connections between ports of the blocks and physical and mechanical configuration parameters. The functional blocks and design of the layout may be hierarchical in nature. The signal route estimation may be based on control factors such as the specification of signal route establishment algorithms. The next step is to foliate the nodes followed by determining resistance and capacitance values corresponding to all or parts of the estimated signal routes. The resistive and capacitive values may be incorporated into a model and a connectivity net list may be generated.

27 Claims, 1 Drawing Sheet

RESISTANCE AND CAPACITANCE ESTIMATION

TECHNICAL FIELD

This application relates in general to VLSI design and in specific to a method used to estimate the resistance and capacitance values associated with signal routing and interconnects between blocks in a VLSI design before the actual layout and route is completed.

BACKGROUND

In a large scale VLSI design project, the initial step is to create a description of what the chip is going to do. This description is created in Register Transfer Language ("RTL"). One of the design considerations in a chip layout is to optimize the RC values of the configuration and minimize the negative effects that the RC values may have on timing. Connection paths for signals between different blocks of the chip have inherent RC values that may cause delays in propagation. According to known methods, the RC values have been either ignored completely or approximated by considering only a capacitance component at the initial description stage of a VLSI design project. This was acceptable because RC delays are typically low compared to gate delays. According to one prior method, the resistive component could be disregarded at the initial layout stage and the total line capacitance is just lumped. In the past, this produced a fair estimation. Another method was to explicitly place RC's in the schematics. This involved roughly planning out where various blocks would be placed. The length of the wire may be measured in order to derive the resistance and capacitance on a wire or path so that it may be added to a schematic layout. This process made it difficult to consider the RC values as components were moved or different configurations were explored, because the values needed to be recalculated.

The initial design was an RTL phase with a program defining the chip functions. Next was a schematic phase which arranged gates and other components in a schematic. Finally, there was the layout phase. The RTL phase did not give consideration to RC values. The schematic phase would try to incorporate some RC values such as lump capacitance, consider certain limited RC elements or completely ignore RC values. Traditional RC values were not considered until the artwork phase or layout phase of the project. At that point tools would extract the actual RC elements and a timing model could evaluate how fast the chip could be run and evaluate the impact of RC delay. The drawback to this methodology is that the design effort was relatively far along before RC delays were considered, making it very difficult to revise the design to overcome the negative impact of such RC delays.

SUMMARY OF THE INVENTION

It is an object of the invention to overcome these and other disadvantages in the prior art. It is an object to provide a methodology to consider RC values at an earlier stage of the VLSI chip design in order to facilitate optimization, thereby minimizing delays. It is an object to provide a methodology to facilitate VLSI chip design, which permits higher operating speeds. It is a further object of the invention to consider RC delays at an earlier stage of the VLSI design process. It is a further object to create VLSI chips designed according to an advanced methodology which considers RC delays at an early stage of the design process.

These and other objects, features and technical advantages are achieved by a system and method as described herein.

According to a feature of the invention, a tool is provided to perform RC estimation at the RTL design phase. Early in a design project a floor planning tool may be used to obtain a rough composition or prediction of the proposed chip layout, including port and component and block placement. An RC estimation tool may then estimate a port to port route and estimate the chip topology for the route and derive RC values. The tool may then build a net list specifying connections and including RC values in a timing model. This permits a timing analysis early in the design project. According to the invention, both the resistive and the capacitive characteristics of the signal paths may be incorporated into the timing model. This avoids the approximations inherent in ignoring the RC values or lumping the capacitance.

One advantage according to the invention is that the RC is distributed in the model which models the characteristics of real silicon more realistically than a lump capacitance. According to the invention, optimization of RC characteristics is much easier to accomplish with a design tool at an early stage than it was at a later stage with estimated explicit RC's in a schematic. The use of a design tool permits a process that allows reconfiguration of route topology, metal space, width and coupling coefficients. It also permits variations of components and geography that affect the RC characteristics.

One advantage of the use of a methodology or protocol according to the invention is the facilitation of use of data hierarchically. A tool permits analysis at a block level and then establishment of a composition of multiple blocks, in a hierarchical manner. It may be advantageous to permit establishment of 20 or more layers in such a hierarchy. One advantage of the invention is the ability to explore many layout options without changing hard coded RC values in the schematic. This facilitates quickly moving blocks around and re-estimating the signal path routing to determine timing. This is an advance over the prior methodology which required manual estimation of signal path propagation delays. One advantage is that the net list outputs may be in the same format as used for full extraction design tools. This facilitates use of the net list and RC timing model by all other tools used in the VLSI design process.

According to an advantageous feature of the invention, a method may be provided suitable for VLSI chip design. The features relate primarily to the initial stages of the design and facilitate early consideration of resistive and capacitive characteristics of signal paths. The method may include the steps of estimating signal routes between functional blocks, optionally followed by the step of foliating nodes in the estimated signal routes. An advantageous feature includes determining resistance and capacitive values for the estimated signal routes and may include building a model of said signal paths, including the resistance and capacitive values. Advantageously, the method may include the step of generating a connectivity net list from the model. This step of estimating may be performed based on an input of a floor plan, a connectivity description, and manual or physical configuration parameters. The estimation process may also be controlled by a number of factors, including specification of signal routing algorithms. The configuration information may vary over the length of a signal path or vary for the routes between various nodes. Likewise, the resistance and capacitance values ascertained during the step of determining may be broken down for portions of the signal route and need not be lumped approximations for the entire route. The step of determining RC values may be done by a look-up table. The look-up table process may use interpolation to arrive at a more accurate estimation for data points falling between entries in the table. Alternatively, the step of determining RC values may be performed by direct and actual calculations.

The invention also encompasses chips manufactured after being designed by the afore described process.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWING

For a more complete understanding of the present invention, and the advantages thereof, reference is now made to the following descriptions taken in conjunction with the accompanying drawing, in which.

DETAILED DESCRIPTION

Figure 1:
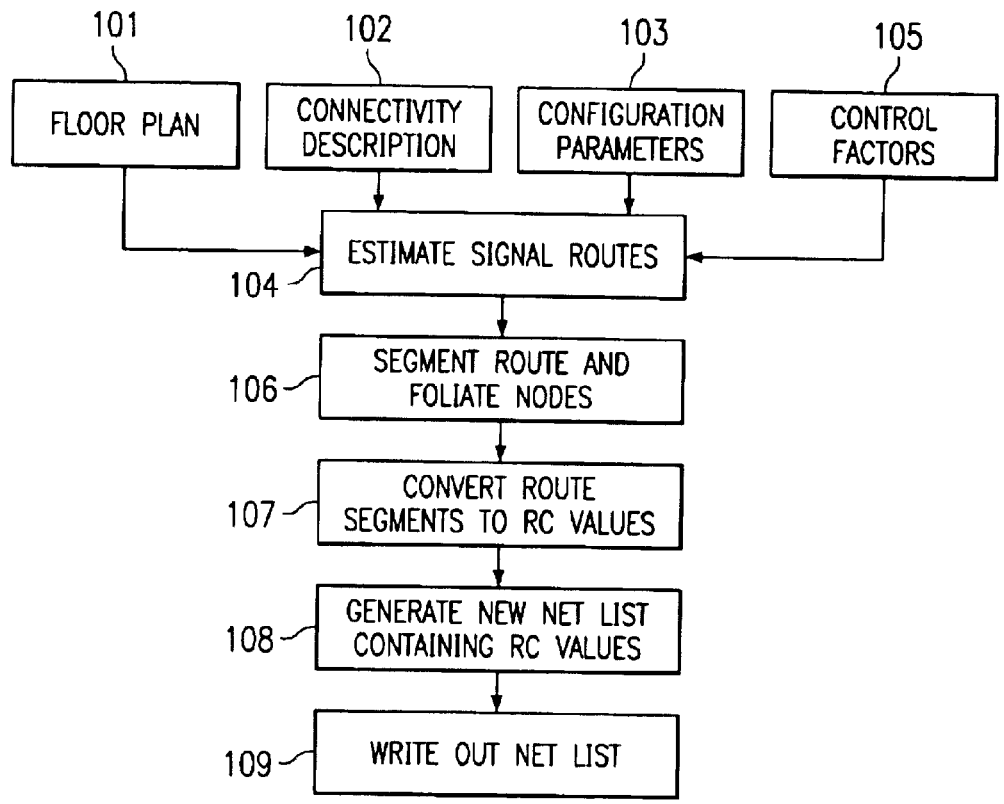
FIG. 1 illustrates a flow diagram for an embodiment of a design protocol according to the invention.

FIG. 1 illustrates a flow chart for an embodiment of the method for RC Estimation ("RCE") according to the invention. This RC Estimation protocol is intended to facilitate early consideration of RC characteristics in the design process by incorporation of RC elements into the VLSI design model early in the design. There are three primary elements to consider. First is a floor plan 101, identifying functional blocks and potentially block hierarchy. The plan identifies functional blocks and the location of such blocks and where the ports are on those blocks. Second is a connectivity description 102 defining the connections to the ports on the blocks, including the interconnection between the ports of one block to the other blocks. Third is a configuration file 103 that specifies physical and mechanical parameters such as identification of metals to use and spacing.

The configuration file 103 may also include tolerance factors that may be used to specify how much scale variation should be used in order to account for non-ideal routes that may result which may be used in later iterations of the design. Such variation may occur when attempts to optimize paths for priority signals necessitate establishing non-ideal signal routes for lower priority signals. The tolerance factor, if used at all, may be part of the configuration input 103 or a separate input. The tolerance factor permits scaling of the RC characteristics established for early consideration. For example, a tolerance factor of 1.2 will scale up the characteristics by 20 percent.

An automated design tool then establishes an estimate of what the route will look like 104. The tool will establish estimated signal routes based on the floor plan 101, the connectivity description 102, and the configuration parameters 103. The signal route estimation may be controlled by various constraints or parameters. According to one embodiment controls factors 105 may dictate establishment of a signal path using a Steiner route, which is the absolute minimum amount of metal to connect up the specified points. Alternatively, a Spine route may be specified. Spine routes are used often in VLSI design. A Spine route uses one metal "spine" to span the length of all the ports and exhibits taps between the connection points to the ports and the spine. Combinations of these or other algorithms may be used. Other configurations can also be specified by algorithm or on a signal by signal basis.

The next step is to foliate the nodes 106, which means give unique names to each of the different points along this estimated route. That is needed to model component value estimations (such as resistance and capacitance) between the nodes.

The next step is to convert route segments to RC values 107. This RC lookup process is accomplished with a tool that looks up the resistance and capacitance values. Given a certain metal layer and width and space and length and MCF coupling factor and temperature, and any other parameters considered in the particular configuration, a value may be retrieved from a table. The table may be a very large spreadsheet that has been derived from real process data. The results may be based on empirical test data or extrapolated from such test data based on what is really seen in silicon. Note that MCF stands for "Miller Coupling Factor," which is a capacitance coupling factor. The Miller Coupling Factor is a measure of how much capacitance on a routed signal could be effected by neighboring signals that are switching their voltage level, which can double the effective capacitance on a signal. Taking the factor or others like it into account will greatly improve the accuracy.

The next step performed is to add the RC values to the model and connect the estimated "virtual" components in the appropriate locations in the signal paths 108. Each segment of the route is replaced by the equivalent RC values found during the lookup process.

The next step 109 is to generate a net list that contains all of the connectivity description including all of the RC elements in a format that is suitable as an input for the timing modeling tools and for tools used to establish the actual design.

The timing modeling and actual design tools are not described herein or the subject of this disclosure, for example, Pathmill from synopsis.

Figure 2:
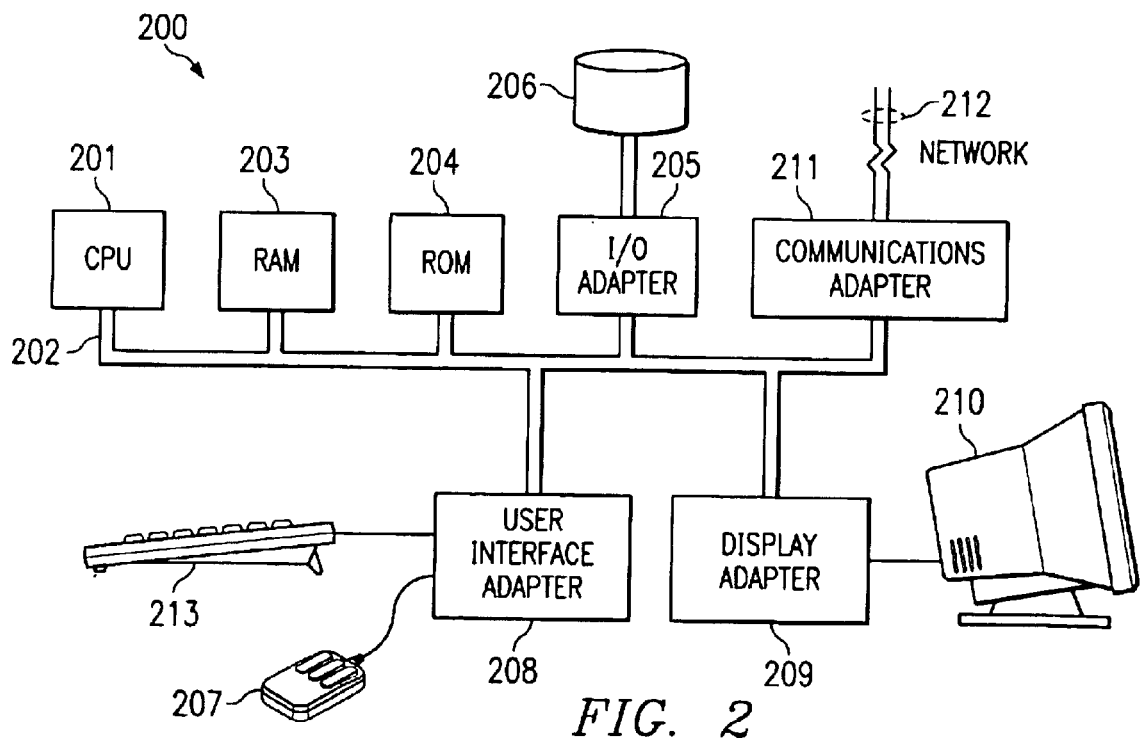
FIG. 2depicts a block diagram of a computer system which is adapted to use the present invention.

FIG. 2 illustrates computer system 200 adapted to use the present invention. Central processing unit (CPU) 201 is coupled to system bus 202. The CPU 201 may be any general purpose CPU, such as an HP PA-8200 or Intel Pentium II processor. However, the present invention is not restricted by the architecture of CPU 201 as long as CPU 201 supports the inventive operations as described herein. Bus 202 is coupled to random access memory (RAM) 203, which may be SRAM, DRAM, or SDRAM. ROM 204 is also coupled to bus 202, which may be PROM, EPROM, or EEPROM. RAM 203 and ROM 204 hold user and system data and programs as is well known in the art.

The bus 202 is also coupled to input/output (I/O) controller card 205, communications adapter card 211, user interface card 208, and display card 209. The I/O card 205 connects to storage devices 206, such as one or more of hard drive, CD drive, floppy disk drive, tape drive, to the computer system. Communications card 211 is adapted to couple the computer system 200 to a network 212, which may be one or more of local (LAN), wide-area (WAN), Ethernet or Internet network. User interface card 208 couples user input devices, such as keyboard 213 and pointing device 207, to the computer system 200. The display card 209 is driven by CPU 201 to control the display on display device 210.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for VLSI chip design comprising the steps of:
   estimating signal routes between functional blocks;
   foliating nodes in the estimated signal routes;
   determining resistance and capacitance values for route segments between the foliated nodes of the estimated signal routes; and
   building a model of said signal routes including resistance and capacitance values;
   wherein the VLSI chip design is in register transfer language.

2. A method according to claim 1 further comprising the step of:
   foliating nodes in estimated signal routes.

3. A method according to claim 1 further comprising the step of:
   generating a connectivity net list from said model.

4. A method according to claim 1 wherein said step of estimating is performed based on input of a floor plan and a connectivity description.

5. A method according to claim 4 wherein said step of estimating is performed in response to one or more control factor inputs.

6. A method according to claim 5 wherein said control factor input specifies a signal routing algorithm.

7. A method according to claim 4 wherein said step of estimating is performed based on input of signal route configuration parameters.

8. A method according to claim 7 wherein said signal route configuration parameters specify one or more of signal route material, physical size of signal route material or spacing.

9. A method according to claim 7 wherein said step of estimating is performed in response to one or more control factor inputs.

10. A method according to claim 9 wherein said control factor input specifies a signal routing algorithm.

11. A VLSI chip whose design was performed according to a method comprising the steps of:
    estimating signal routes between functional blocks;
    foliating nodes in the estimated signal routes;
    determining resistance and capacitance values for route segments between the foliated nodes of the estimated signal routes; and
    building a model of said signal routes including resistance and capacitance values;
    wherein the design is in register transfer language.

12. A VLSI chip according to claim 11 whose design was performed according to the method further comprising the step of:
    foliating nodes in estimated signal routes.

13. A VLSI chip according to claim 11 whose design was performed according to the method further comprising the step of:
    generating a connectivity net list from said model.

14. A VLSI chip according to claim 11 whose design was performed according to the method wherein said step of estimating is performed based on input of a floor plan and a connectivity description.

15. A VLSI chip according to claim 14 whose design was performed according to the method wherein said step of estimating is performed in response to one or more control factor inputs.

16. A VLSI chip according to claim 15 whose design was performed according to the method wherein said control factor input specifies a signal routing algorithm.

17. A VLSI chip according to claim 14 whose design was performed according to the method wherein said step of estimating is performed based on input of signal route configuration parameters.

18. A VLSI chip according to claim 17 whose design was performed according to the method wherein said signal route configuration parameters specify one or more of signal route material, physical size of signal route material or spacing.

19. A VLSI chip according to claim 17 whose design was performed according to the method wherein said step of estimating is performed in response to one or more control factor inputs.

20. A VLSI chip according to claim 19 whose design was performed according to the method wherein said control factor input specifies a signal routing algorithm.

21. A system for forming a VLSI chip design comprising:
    means for estimating signal routes between functional blocks;
    means for foliating nodes in the estimated signal routes;
    means for determining resistance and capacitance values for route segments between the foliated nodes of the estimated signal routes; and
    means for building a model of said signal routes including resistance and capacitance values;
    wherein the VLSI chip design is in register transfer language.

22. A method according to claim 1 wherein the estimating signal routes between functional blocks occurs prior to a layout for the VLSI chip design.

23. A VLSI chip according to claim 11 wherein the estimating signal routes between functional blocks occurs prior to a layout for the VLSI chip.

24. A system according to claim 21 wherein the estimating signal routes between functional blocks occurs prior to a layout for the VLSI chip design.

25. The method of claim 1 wherein determining comprises:
    determining resistance values and capacitance values for the estimated signal routes.

26. The method of claim 11 wherein determining comprises:

determining resistance values and capacitance values for the estimated signal routes.

27. The system of claim 21 wherein the means for determining comprises:

means for determining resistance values and capacitance values for the estimated signal routes.

\* \* \* \* \*